(12) United States Patent  
Tullidge et al.

(10) Patent No.: US 8,575,492 B2  
(45) Date of Patent: Nov. 5, 2013

(54) HOLE IN PAD THERMAL MANAGEMENT

(75) Inventors: Lee H. Tullidge, Urbana, OH (US); Leonard De Oto, Springfield, OH (US); Tim Larson, Minnetonka, MN (US); Patrick O'Keefe, Minnetonka, MN (US); Herb Gertz, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/396,485

(22) Filed: Feb. 14, 2012

(65) Prior Publication Data

US 2012/0138341 A1    Jun. 7, 2012

Related U.S. Application Data

(62) Division of application No. 11/868,871, filed on Oct. 8, 2007, now Pat. No. 8,112,884.

(51) Int. Cl.  
*H05K 1/00* (2006.01)

(52) U.S. Cl.  
USPC .............................. 174/252; 174/262; 174/264

(58) Field of Classification Search  
None  
See application file for complete search history.

(56) References Cited

U.S. PATENT DOCUMENTS

| | | | | |
|---|---|---|---|---|
| 6,441,312 | B1 * | 8/2002 | Tanimura et al. | 174/252 |
| 6,477,054 | B1 * | 11/2002 | Hagerup | 361/720 |
| 6,787,896 | B1 * | 9/2004 | Petty-Weeks | 257/700 |
| 7,026,664 | B2 * | 4/2006 | Divakar et al. | 257/107 |
| 2006/0186535 | A1 * | 8/2006 | Baker et al. | 257/720 |

* cited by examiner

*Primary Examiner* — Ishwarbhai Patel  
(74) *Attorney, Agent, or Firm* — Ingrassia Fisher & Lorenz, P.C.

(57) ABSTRACT

A device and method of heat sinking a surface mount device (SMD) component. In an example method through holes are formed in a printed circuit board (PCB), a first copper layer is electroless plated in the holes, a second copper layer is standard plated in the holes and surrounding surfaces of the PCB, a third copper layer is masked and pulse plated in the holes, the holes are filled with non-conductive material and then is sanded flush with the second copper layer. A fourth copper layer electroless plated on the PCB over the area of the holes, a fifth copper layer (or pad) plated on the PCB over the area of the holes, and a surface mount device is attached to the fifth copper layer.

5 Claims, 14 Drawing Sheets

HOLE IN PAD THERMAL MANAGEMENT

PRIORITY CLAIM

This application is a Divisional of Ser. No. 11/868,871, filed Oct. 8, 2007, now U.S. Pat. No. 8,112,884 issued Feb. 14, 2012.

BACKGROUND OF THE INVENTION

Surface mount device (SMD) and thru-hole component packages that dissipate high power levels, such as Light Emitting Diodes (LEDs), present unique thermal problems in the design of printed circuit boards (PCBs). Component manufacturers provide tabs, slugs, or other metal protrusions from their packages to help remove the heat from the junction of the device. The challenge at the next level of design is sinking the heat away from the component to a metal heat sink.

When designing PCBs to include devices such as surface-mounted LEDs, designers may be forced to use more expensive metal core boards in order to dissipate the heat generated by the LEDs. What is needed is a method of manufacturing a non-metal core board with equivalent or superior thermal performance to be able to sink away the large amounts of heat associated with SMD components such as LEDs with high power levels.

SUMMARY OF THE INVENTION

The present invention uses via in pad technology to prepare a large cross-sectional area of a thermally conductive material, such as copper, to provide thermal conductivity from the pad, slug, tab, or metal protrusion of a surface mount device (SMD) or thru-hole component to the opposite side of a printed circuit board (PCB). On the opposite side of the PCB, a heat sink is used to enable the flow of heat away from the assembly. The pads may vary in size and thickness of copper depending on the thermal properties of the component that requires heat sinking.

The present invention includes a method of heat sinking an SMD component including: drilling through holes in a PCB; electroless plating a first copper layer in the holes; standard plating a second copper layer in the holes and on the top and bottom surfaces; masking areas of the PCB that do not include the via in pad holes; pulse plating a third copper layer in the holes; filling the holes with either conductive or non-conductive material and sanding flush with the second copper layer; electroless plating a fourth copper layer on the PCB over the area of the holes; plating a fifth copper layer (or pad) on the PCB over the area of the holes; and attaching the SMD or thru-hole component to the pad.

In accordance with further aspects of the invention, a device for heat sinking an SMD or thru-hole component is provided, including a PCB with a plurality of through holes, the holes being plated with three copper layers and filled with non-conductive or conductive filler, both ends of the holes further covered with two layers of copper forming pads.

As will be readily appreciated from the foregoing summary, the invention provides an improved device and method of heat sinking an SMD or thru-hole component.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1A:
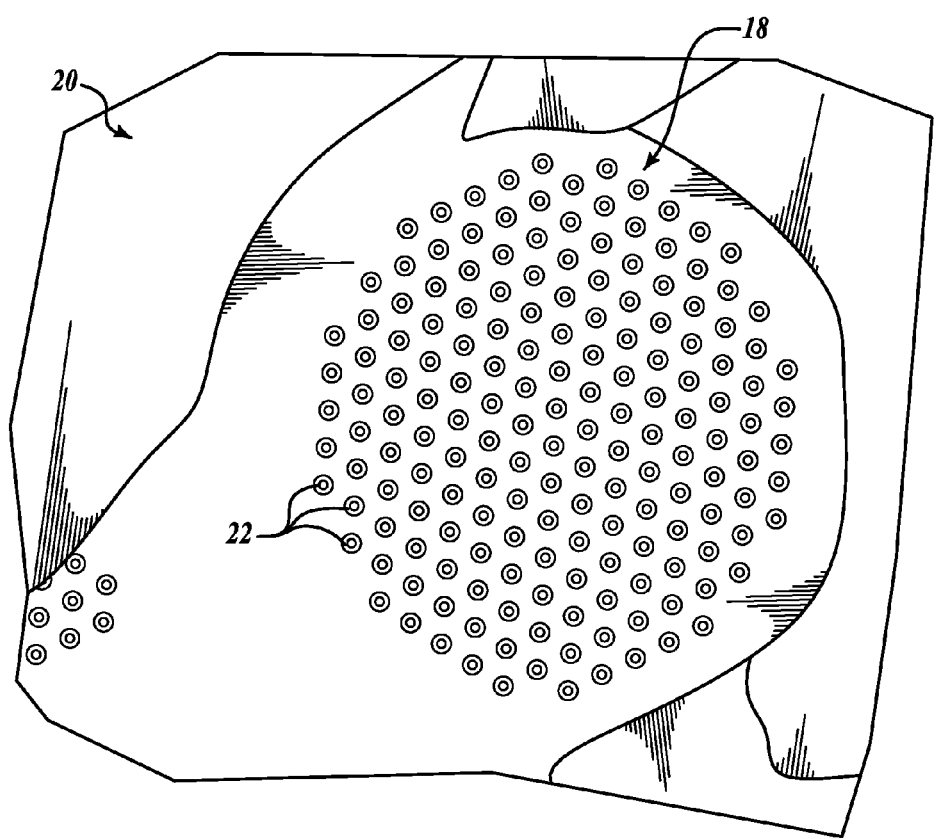
FIGS. 1A-1C show portions of printed circuit boards (PCBs) formed in accordance with an embodiment of the present invention.
Figure 1B:
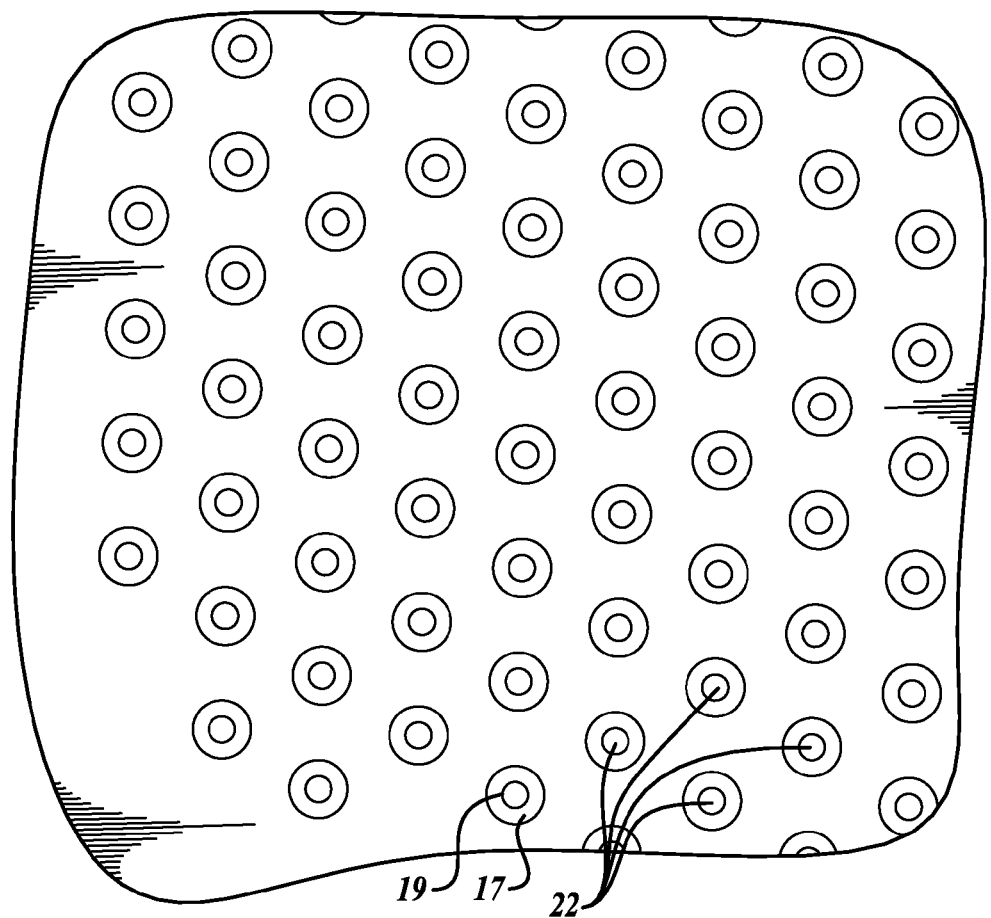
Figure 1C:
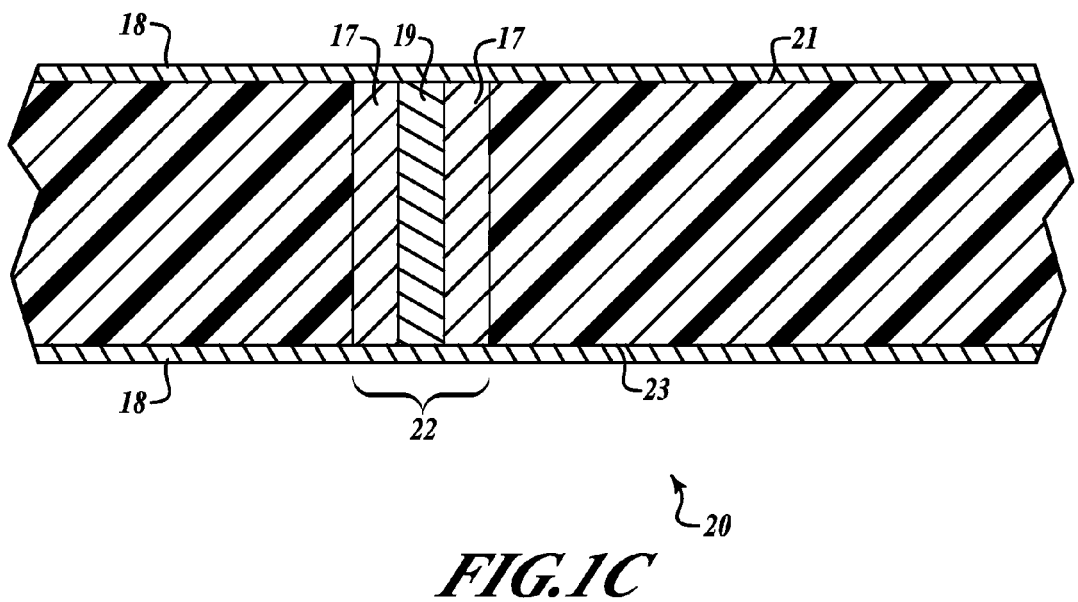

FIG. 1A shows a top view of a portion of a printed circuit board (PCB) 20, including a slug pad 18 and multiple copper-lined and non-conductive material filled vias (or holes) 22. The slug pad 18 includes copper and covers the vias 22. The pad 18 provides a thermally conductive path to all of the vias 22 and helps to promote an even distribution of thermal flow through the area of the PCB 20 covered by the pad 18. FIG. 1B shows a magnified view of the vias 22 of FIG. 1A. The vias 22 include a copper lining 17 (which may include more than one layer of copper) and a filler material 19. FIG. 1C shows a side cross-sectional view of a PCB 20 with vias 22.

Figure 2:
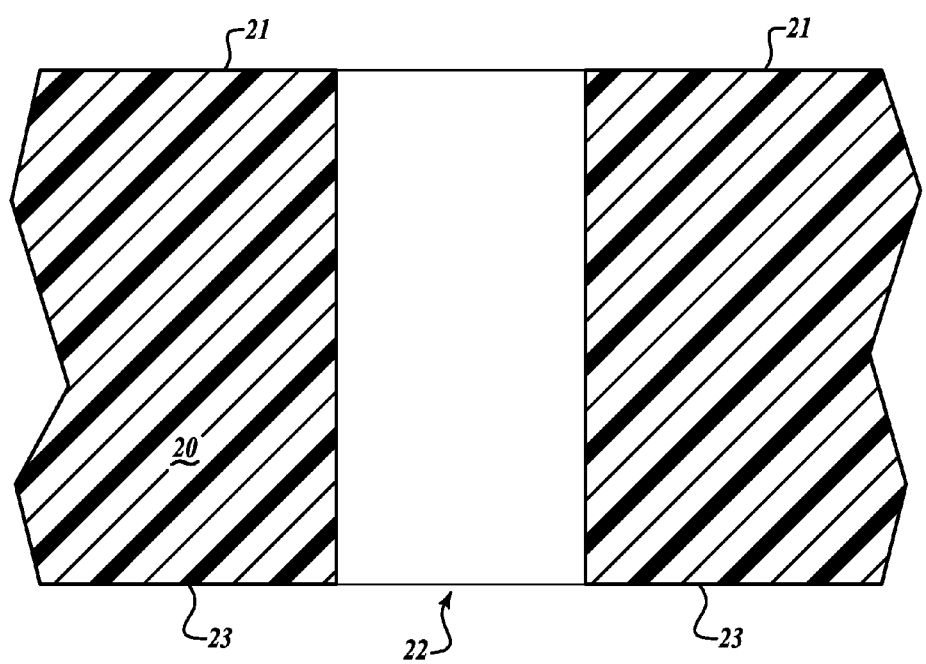
FIGS. 2-11B are cross-sectional views of a portion of a printed circuit board (PCB) including a via during manufacturing steps of an embodiment of the present invention.

FIG. 2 shows a PCB 20, which may be made from FR4 circuit board material, according to the present invention with a top surface 21 and a bottom surface 23 after drilling one or more vias 22 through the board 20. Vias 22 are drilled in the area of the PCB 20 where a surface mount device (not shown) is to be mounted. One presently preferred embodiment uses 0.012 inch diameter vias 22 spaced 0.02 inches apart with each row staggered by 0.01 inch. This configuration is used with a slug pad 18 that is 0.305 inches in diameter, and a total of about 170 vias 22 are drilled. Generally, more vias 22 allow more copper to be deposited in the vias 22, which increases the amount of heat transfer through the vias 22. With a total of about 170 vias 22, approximately three ounces or more of copper can be deposited into the vias 22. Note that as few as approximately 10 vias 22 can be used.

Figure 3:
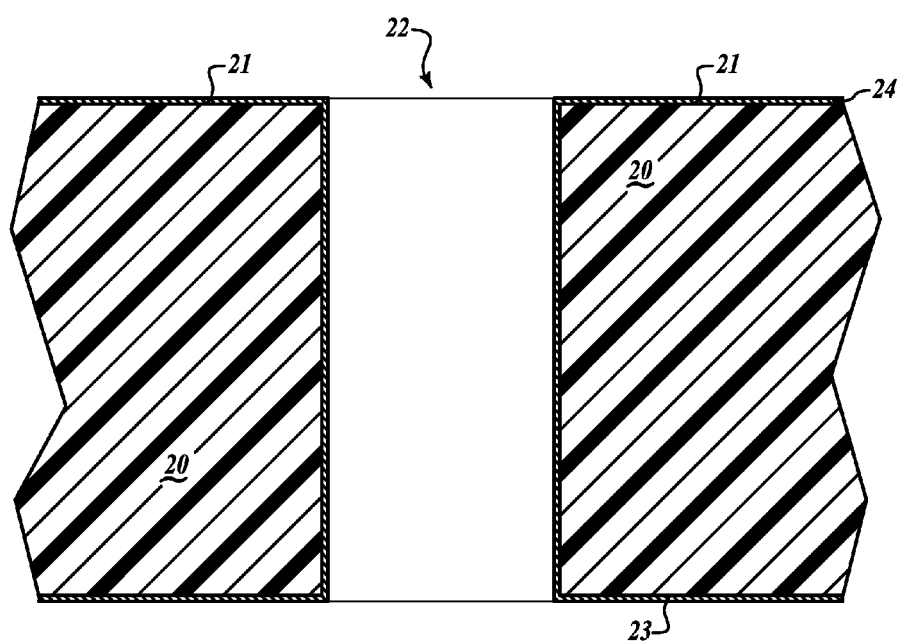

FIG. 3 shows the PCB 20 after a first thin film (approximately 50 micron) copper layer 24 has been applied in the vias 22 and on the top and bottom surfaces 21, 23. The layer 24 is applied using an electroless copper plating technique. All copper layers deposited using the electroless copper plating technique are approximately 50 microns thick.

Figure 4:
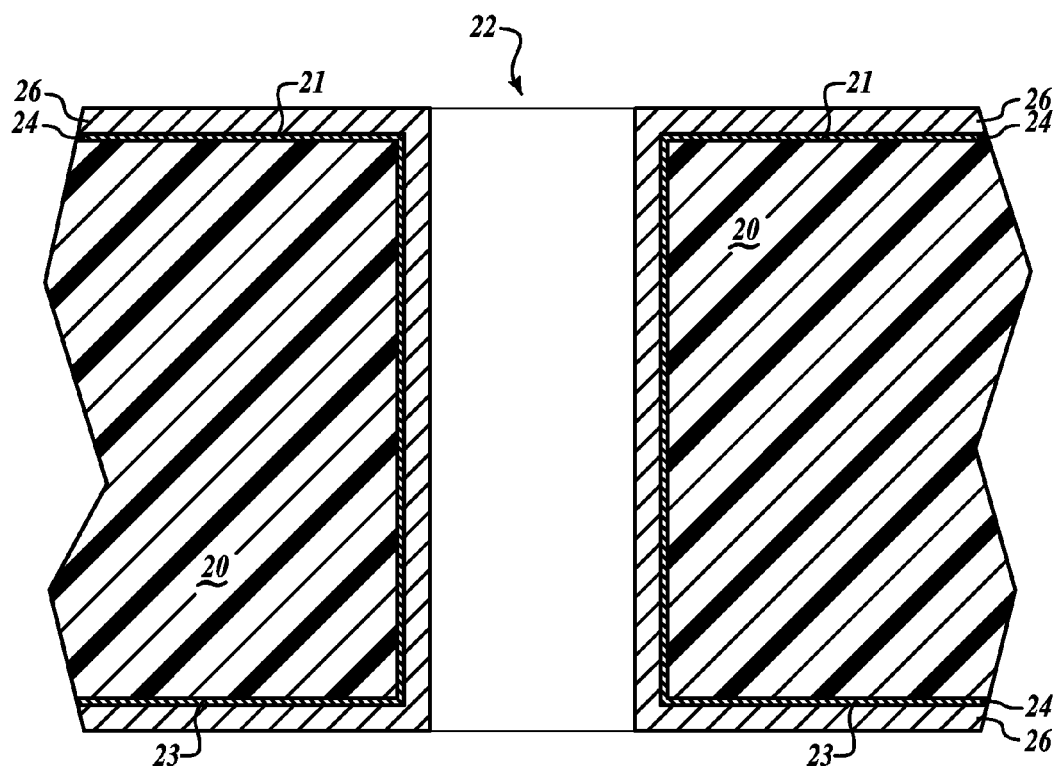
Figure 5:
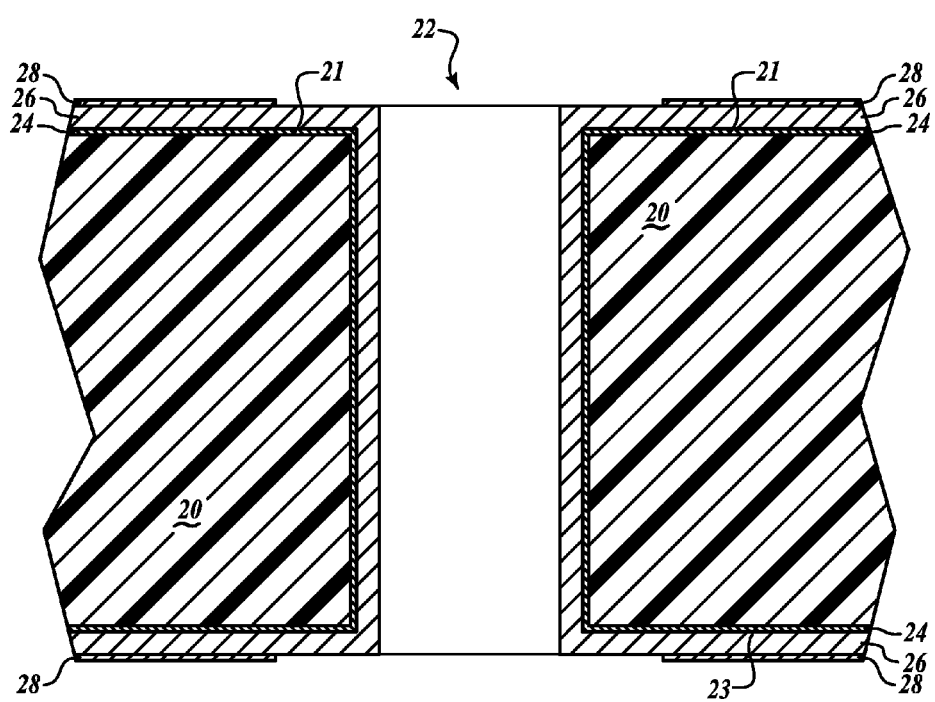

FIG. 4 shows the PCB 20 after depositing a second copper layer 26 with a minimum thickness of about 0.0005 inches in the vias 22 and top and bottom surfaces 21, 23. The layer 26 is applied using standard PCB electroplating processes. FIG. 5 shows the PCB 20 after a masking layer 28 has been applied. The masking layer 28 is applied using a standard PCB photo-resist process, and includes both surfaces 21, 23 of the PCB 20 except the area of the vias 22.

Figure 6:
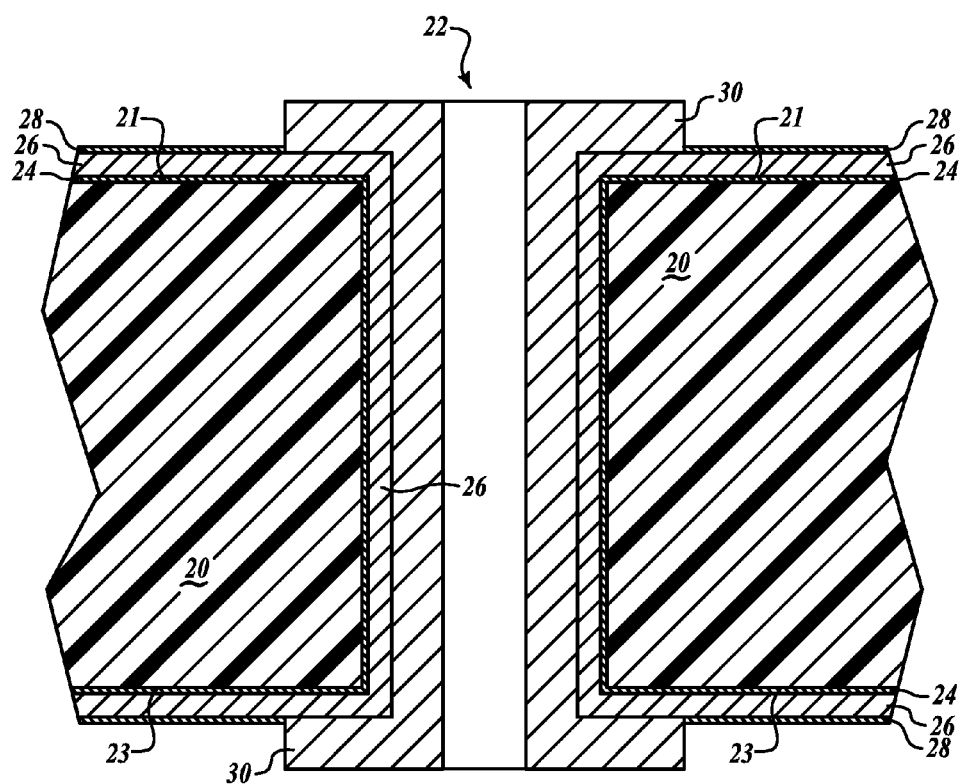

FIG. 6 shows the PCB 20 after masking and pulse-plating a third copper layer 30 with a thickness of about 0.003 inches. The actual thickness of the third copper layer 30 may be the primary determinant of how effective the transfer of heat from the top surface 21 of the board 20 to the bottom surface 23 will be. It is important to keep the walls of the layer 30 somewhat uniform as the next steps involve filling the vias 22 with filler and sanding. If the vias 22 are not properly filled, a multitude of problems may be encountered during later processing steps.

Figure 7:
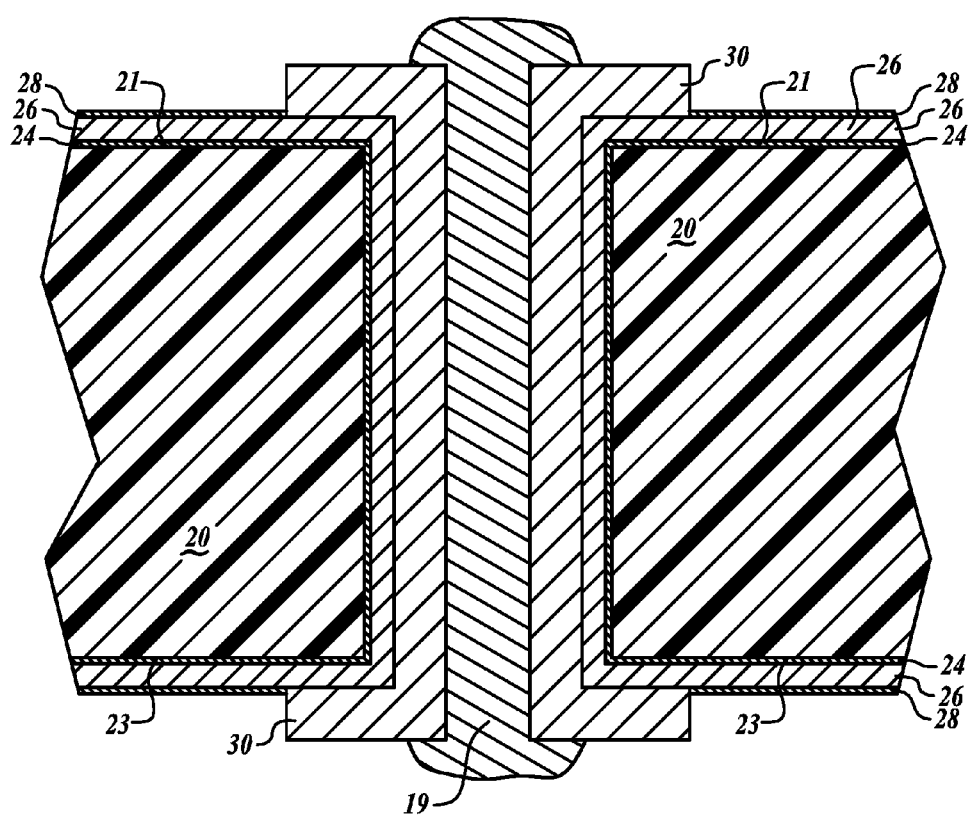
Figure 8:
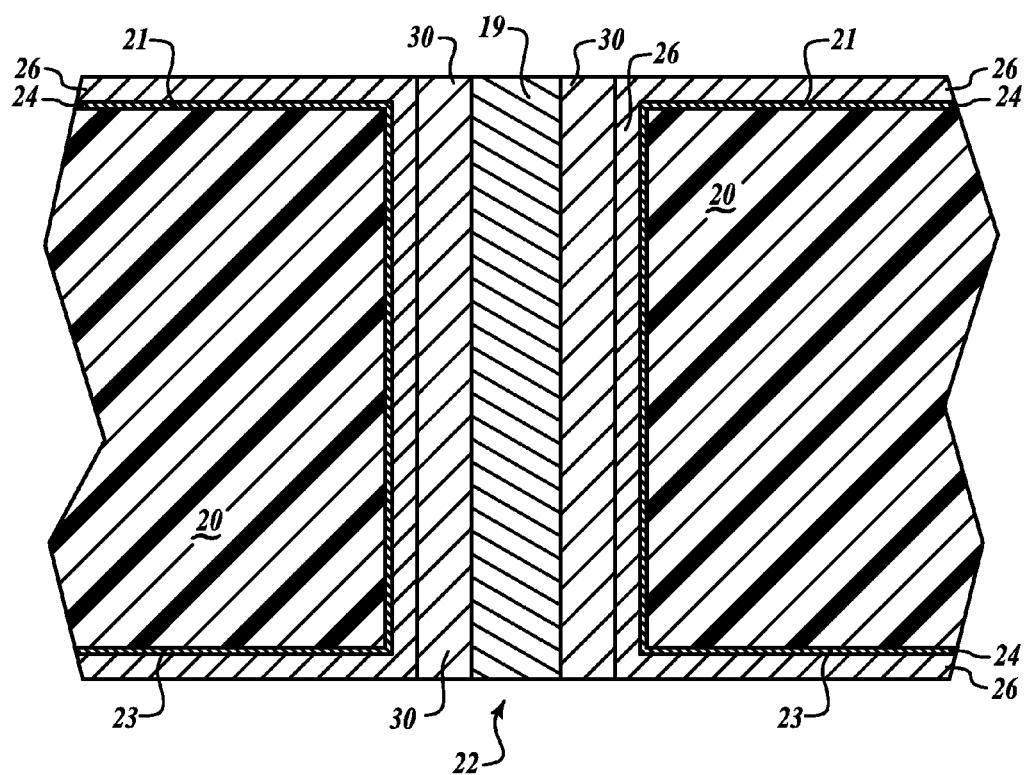

FIG. 7 shows the PCB 20 after filling the vias 22 with filler material 19, and FIG. 8 shows the PCB 20 after sanding down to the second copper layer 26. The filler material 19 may include conductive or non-conductive materials.

Figure 9:
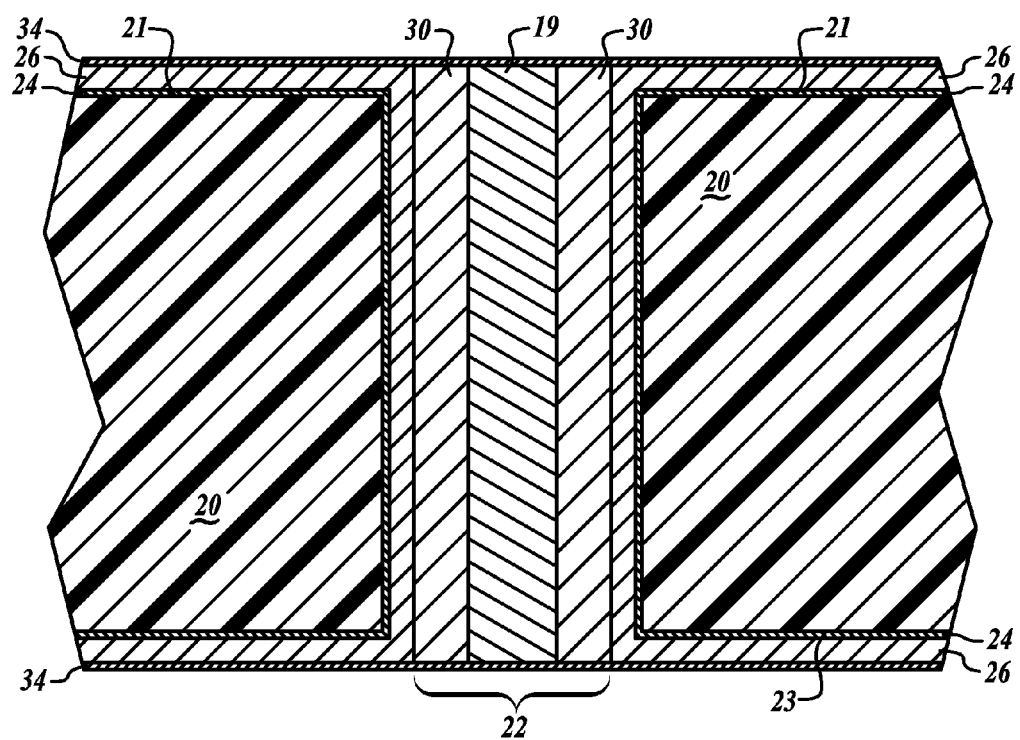
Figure 10:
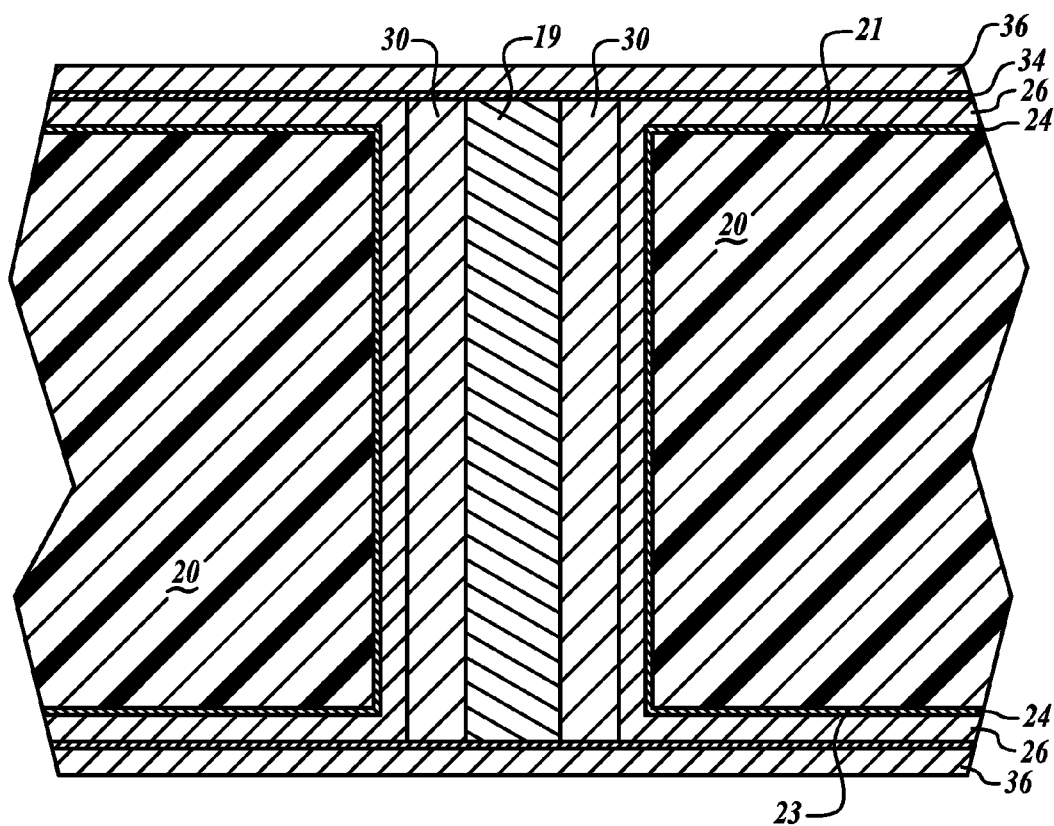
Figure 11A:
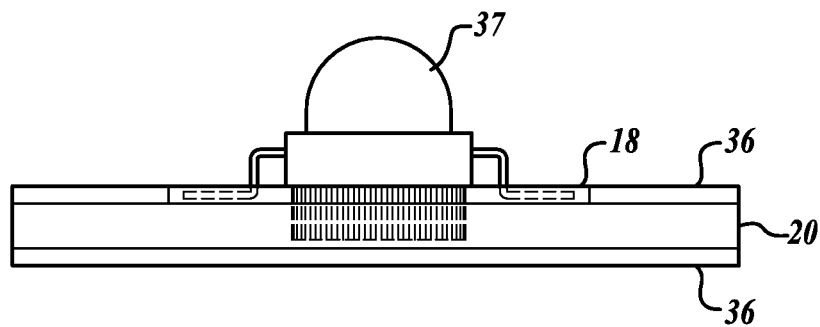
Figure 11B:
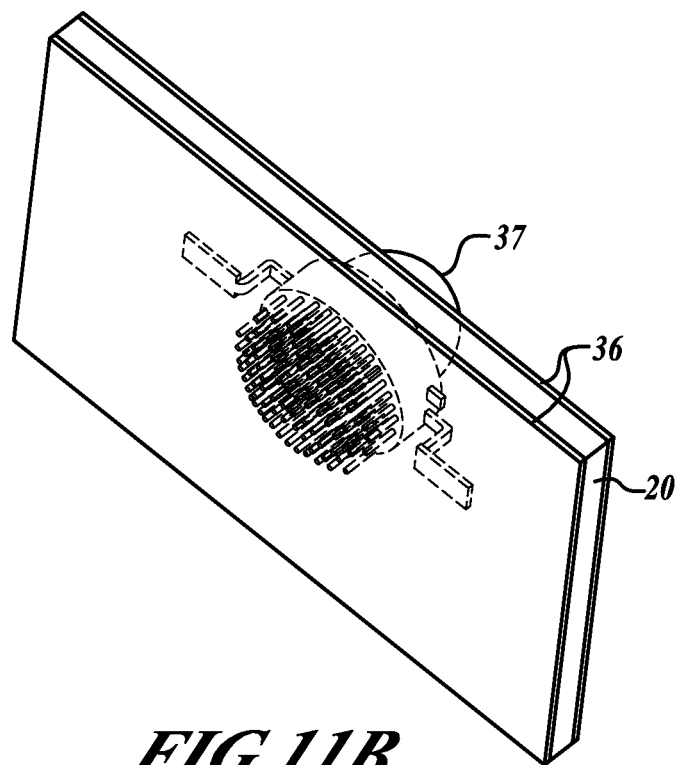

FIG. 9 shows the PCB 20 after a second drilling operation to create all other vias and holes (not shown) that are not thermal management holes, and a fourth copper layer 34 is deposited using an electroless copper plating technique. FIG. 10 shows the PCB 20 after depositing a fifth copper layer 36 on the pad area of both surfaces 21, 23 of the PCB 20. After the fifth copper layer 36 is deposited, an SMD component such as an LED 37 is attached to the fifth copper layer 36, as shown in FIGS. 11A and 11B.

Figure 12:
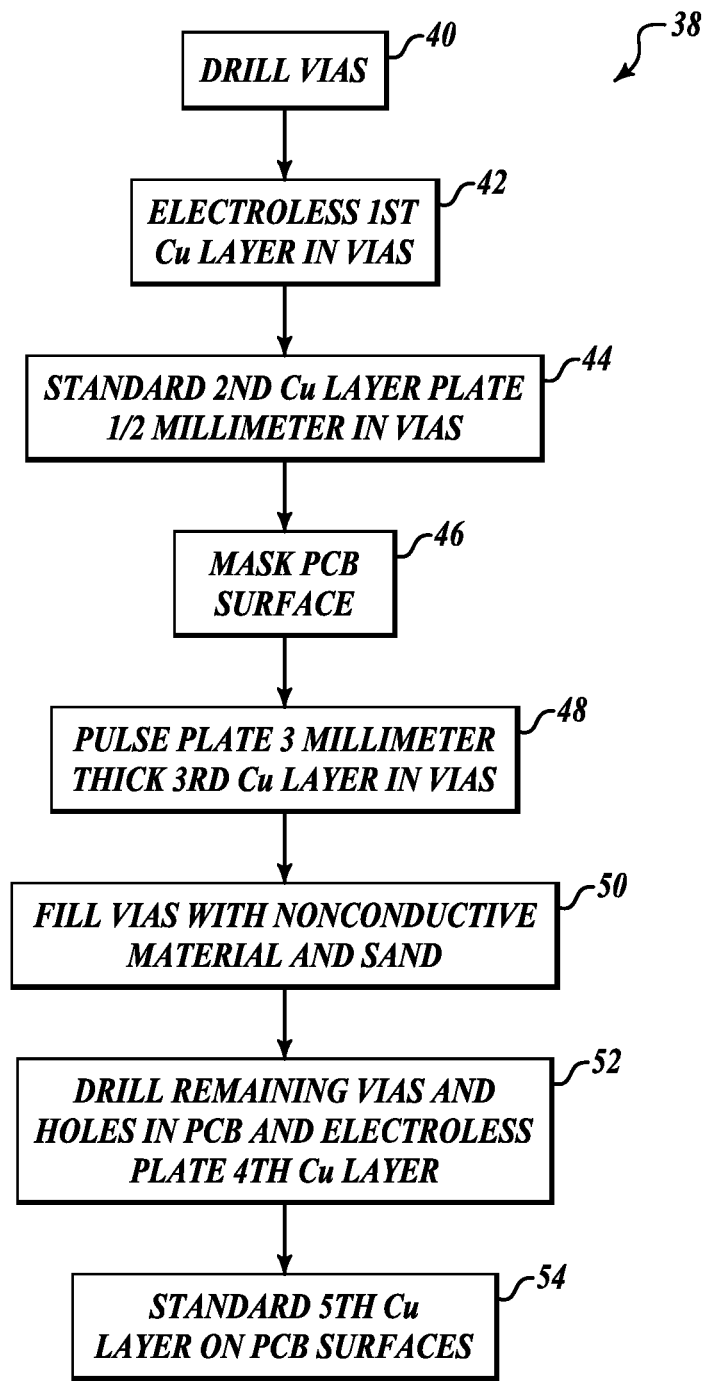
FIG. 12 is a block diagram of a method according to the present invention.

FIG. 12 is a block diagram 38 of a method according to an embodiment of the present invention. At a first block 40, vias are drilled into the PCB, producing the structure of FIG. 2. At a block 42, a first copper layer is deposited in the vias using an electroless copper plating technique, producing the structure of FIG. 3. At a block 44, standard PCB plating techniques are used to deposit an approximately 0.0005 inch thick second copper layer in the vias, producing the structure of FIG. 4. At a block 46, a mask layer is placed on the top and bottom surfaces excluding the pad geometry containing the thermal management holes, producing the structure of FIG. 5. At a block 48, an approximately 0.003 inch thick third layer of copper is deposited in the vias using pulse plating, producing the structure of FIG. 6. At a block 50, the vias are filled with filler material, producing the structure of FIG. 7, and the structure is sanded down to make the pad geometry flush with the rest of the second layer of copper, producing the structure of FIG. 8.

At a block 52, all remaining vias and holes that are not thermal management holes are drilled, and a fourth copper layer is deposited on the surfaces of the PCB using the electroless copper plating technique. Finally, at a block 54, standard PCB plating techniques are used to deposit a fifth copper layer on all surfaces of the PCB. After the fifth copper layer is deposited and the remaining standard processes for producing a PCB are performed, an SMD component such as an LED is attached to the fifth copper layer at a block 56.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A device for providing efficient thermal transfer from a heat-generating component, the device comprising:
   a printed circuit board (PCB) defining a plurality of through holes, each through hole having two ends, the plurality of through holes being within a desired slug pad area,
   wherein the plurality of through holes comprises:
      a first layer of copper attached to a wall of each of the through holes, the first layer of copper has thickness of approximately 50µ;
      a second layer of copper attached to the first layer of copper within each of through holes, the second layer of copper has thickness of at least 12.7µ;
      a third layer of copper attached to the second layer of copper within each of through holes, the third layer of copper has thickness of approximately 75µ; and
      a filler material located adjacent to the third layer of copper,
   wherein and an area of the PCB surrounding the plurality of through holes is covered with a fourth layer of copper,
   wherein an exposed surface of the second and third layers of copper and an exposed surface of the filler material are flush and approximately parallel with a surface of the PCB,
   wherein each of the plurality of through holes has a diameter of less than 0.020 inches,
   wherein the plurality of through holes are spaced apart from each other by more than 0.015 inches.

2. The device of claim 1, wherein an area of the fourth layer of copper corresponds to the desired slug pad area.

3. The device of claim 1, wherein the PCB defines at least about 10 holes within the desired slug pad area.

4. The device of claim 1, wherein the PCB defines at least about 50 holes within the desired slug pad area.

5. The device of claim 1, wherein the desired slug pad area comprises greater than 100 through holes.

\* \* \* \* \*